(12) United States Patent
Manikandan

(10) Patent No.: US 9,716,393 B2
(45) Date of Patent: Jul. 25, 2017

(54) BATTERY BACKUP REMAINING TIME ARRANGEMENT

(71) Applicant: THOMSON LICENSING, Issy de Moulineaux (FR)

(72) Inventor: Dhanuskodi Manikandan, Hamilton, IN (US)

(73) Assignee: THOMSON LICENSING, Issy-les-Moulineaux (FR)

( * ) Notice: Subject to any disclaimer, the term of this patent is extended or adjusted under 35 U.S.C. 154(b) by 651 days.

(21) Appl. No.: 13/915,860

(22) Filed: Jun. 12, 2013

(65) Prior Publication Data

US 2014/0368033 A1 Dec. 18, 2014

(51) Int. Cl.
*H02J 7/00* (2006.01)
*H02J 9/06* (2006.01)
*G01R 31/36* (2006.01)

(52) U.S. Cl.
CPC .............. *H02J 7/0047* (2013.01); *H02J 9/06* (2013.01); *G01R 31/3693* (2013.01); *Y10T 307/344* (2015.04)

(58) Field of Classification Search
CPC ........................... Y10T 307/344; H02J 7/0047
See application file for complete search history.

(56) References Cited

U.S. PATENT DOCUMENTS

| | | |
|---|---|---|
| 5,370,077 A | 12/1994 | Hirano et al. |
| 5,428,252 A | 6/1995 | Walker et al. |
| 6,252,377 B1 * | 6/2001 | Shibutani ........... G01R 31/3624 320/132 |
| 6,317,697 B1 | 11/2001 | Yoshikawa et al. |
| 7,132,951 B2 * | 11/2006 | Ziejewski ................. H02J 3/14 307/29 |

(Continued)

FOREIGN PATENT DOCUMENTS

| | | |
|---|---|---|
| EP | 0864876 | 9/1998 |
| JP | 312575 | 1/1999 |

*Primary Examiner* — Rexford Barnie
*Assistant Examiner* — Daniel Kessie
(74) *Attorney, Agent, or Firm* — Sammy S. Henig; Jerome G. Schaefer

(57) ABSTRACT

For reducing the current consumption from a battery in order to lengthen a battery remaining time when an interruption in a mains supply voltage occurs and battery backup operation follows, a controller initiates shutdown operation of selected devices.—Some of the selected devices experience a shutdown delay of, for example, 1-4 minutes, referred to as a transitional shutdown delay interval, from a time immediately following the interruption to a time when shutdown is fully completed. During the transitional shutdown delay interval, battery remaining time is calculated by using a value that is indicative of anticipatory current consumption, instead of by using the actual real time current measurements. Thus, fluctuation of the current consumption, during the transitional shutdown delay interval, will have no effect on a signal containing the battery remaining time, during the transitional shutdown delay interval. Because the calculated battery remaining time is unaffected by the transient loading, during the transitional shutdown delay interval, any "race" condition and its potentially harmful effects will be, advantageously, prevented.

12 Claims, 2 Drawing Sheets

(56) References Cited

U.S. PATENT DOCUMENTS

| | | | |
|---|---|---|---|
| 7,154,380 B1 | 12/2006 | Tarrab | |
| 7,672,591 B2 * | 3/2010 | Soto | H04B 10/808 398/66 |
| 2005/0086543 A1 * | 4/2005 | Manuell | G06F 11/3006 713/300 |
| 2012/0143585 A1 * | 6/2012 | Barsukov | G01R 31/362 703/18 |

* cited by examiner

BATTERY BACKUP REMAINING TIME ARRANGEMENT

CROSS REFERENCE TO RELATED APPLICATIONS

This application claims the benefit of U.S. Provisional Application Ser. No. 61/777,445 filed Mar. 12, 2013, which is incorporated by reference herein in its entirety.

FIELD OF THE INVENTION

The invention relates to a battery backup arrangement in a power supply. In particular, the invention relates to an arrangement for measuring a length of time, referred to as battery remaining time, during which a battery will have sufficient charge to energize a system following an interruption in a mains supply voltage.

BACKGROUND OF THE INVENTION

Battery remaining time may be calculated in a main controller in a conventional manner in accordance with the charge remaining in the battery and with measured current loading information. It may be desirable to reduce the total current loading from the battery relative to that in normal operation in order to lengthen the battery remaining time, during battery backup operation. Accordingly, a system or main controller may control which device/function should remain energized and which should be powered down or disabled during battery backup operation.

Also, a function/device may self-monitor calculated data that is indicative of battery remaining time and initiate its own shutdown when the data indicates that the battery remaining time is below a threshold value.

Assume that a self-monitoring function/device "A" is required to remain operational, during battery backup operation; whereas, a function/device "B" is required to go into shutdown in order to lengthen the battery remaining time in a manner to enable self-monitoring function/device "A" to remain operational for a longer time. It was discovered that such arrangement potentially could, disadvantageously, create a "race" condition. For example, if the required shutdown of function/device "B" were to be delayed immediately following the interruption, the measured excessive instantaneous current loading could cause the battery remaining time indicative data to be temporarily indicative of a value that is lower than the threshold value associated with self-monitoring function/device "A". This might cause a "race" resulting in self-monitoring function/device "A", undesirably, going into shutdown. It may be desirable to avoid such "race" condition.

In carrying out an inventive feature, during an interval having a length of, for example, 4 minutes, that follows a change from normal operation to battery backup operation, the battery remaining time is calculated in a manner that is affected less or not at all by the measured instantaneous current loading.

SUMMARY OF THE INVENTION

An apparatus for generating a signal indicative of a battery remaining time includes a source of a mains supply voltage for energizing a first load circuit and a second load circuit, prior to an interruption in the mains supply voltage. A battery provides battery backup operation to energize the second load circuit after the interruption in the mains supply voltage is detected. A processor is coupled to the first load circuit for initiating a current drain reduction in the first load circuit, when the interruption is detected in a manner to enhance the battery remaining time, during battery backup operation. The processor is responsive to a magnitude of a battery current supplied by the battery for generating the battery remaining time indicative signal in accordance with the battery current magnitude. During an interval that follows the detection of the interruption, the battery remaining time indicative signal varies in a manner that is unaffected by real time variations in the battery current magnitude.

BRIEF DESCRIPTION OF THE DRAWINGS

The preferred embodiment of the present invention will be described below in more detail with reference to the accompanying drawings in which.

DETAILED DESCRIPTION

Figure 1:
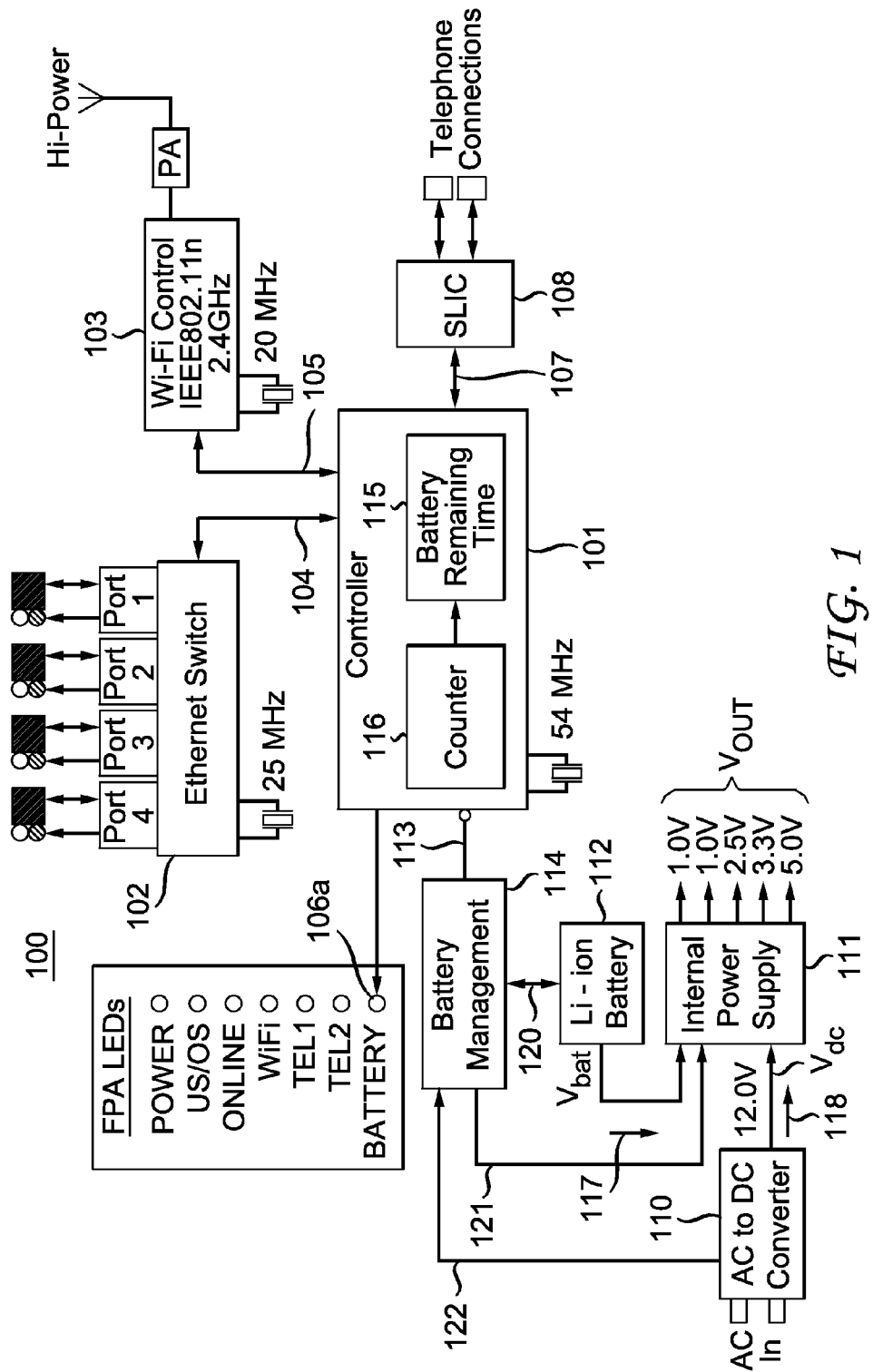
FIG. 1 illustrates a block diagram of a gateway, embodying an inventive feature.

FIG. 1 illustrates a block diagram of a router or gateway 100, embodying an inventive feature, for providing internet and phone service at, for example, a user home. A controller 101 is coupled via conductors 104 to a 4-Port Ethernet switch 102 for providing Ethernet connection a the user home. 4-Port Ethernet switch 102 is conventional, except as discussed later on. Similarly, controller 101 is also coupled via conductors 105 with a Wi-Fi controller 103 for providing Wi-Fi service. Wi-Fi controller 103 is conventional, except as discussed later on. Controller 101 additionally controls light emitting diode (LED) indicators 106. Lastly, controller 101 is coupled via conductors 107 to a subscriber line interface card (SLIC) 108 for providing telephone service to. SLIC 108 is conventional, except as discussed later on.

A source of an alternating current (AC) mains voltage ACin is couple to a conventional converter 110 that produces a direct current (DC) voltage Vdc at an output of AC-to-DC converter 110 from mains voltage ACin. Voltage Vdc is coupled to a regulator 111 that produces supply voltages collectively referred to as voltages Vout for energizing gateway 100 including controllers 101 and 103, switch 102 and SLIC 108.

A Lithium-ion (Li-ion) battery 112 produces a battery voltage Vbat that energizes regulator 111, instead of voltage Vdc, when an interruption occurs in mains voltage ACin. This feature is controlled by a battery management unit 114, in a conventional manner. Battery management unit 114 periodically performs measurements of battery voltage Vbat and of a battery load current 117, in a conventional manner, for updating a data word 113 that is indicative of the charge remaining in battery 112. The battery remaining charge is represented in data word 113 as, for example, a percentage of a maximum charge that can be stored in the battery when the battery is fully charged. Data word 113 is coupled to controller 101.

For reducing loading by load current 117 from battery 112, in order to lengthen the battery remaining time when the interruption occurs and battery backup operation follows, controller 101 initiates shutdown operation of selected functions/devices such as switch 102, controller 103 and LED's 106, except for an LED that indicates battery backup operation mode. On the other hand, SLIC 108 is required to remain active for continuing to provide phone service, during battery backup operation.

Selected devices of gateway 100, for example, switch 102 and controller 103 might experience a shutdown delay of, for example, 1-4 minutes, referred to herein as a transitional shutdown delay interval, from a time immediately following the interruption beginning time to a time when shutdown is fully completed. Therefore, a corresponding delay in the decrease in battery current 117 occurs.

Following the transitional shutdown delay interval, battery management unit 114 periodically monitors current 117 in battery 112 and communicates it to controller 101, in a manner not shown. Controller 101 then calculates and stores a data word 115 containing an updated value of the battery remaining time. The calculation is performed by multiplying the battery charge percentage indicative value in word 113 with the maximum charge stored in the battery when the battery is fully charge and dividing the multiplication result by the magnitude of current 117 from battery 112.

Similarly, during normal operation, when mains voltage ACin is at normal operation amplitude, battery management unit 114 monitors a load current 118 of the fully operational gateway 100, which is substantially higher than during battery backup operation, and communicates it to controller 101, in a manner not shown. Controller 101 then calculates and stores data word 115 containing an updated value of the battery remaining time. The calculation is performed by multiplying the battery charge percentage indicative value in word 113 with the maximum charge stored in the battery when the battery is fully charge and dividing the multiplication result by the magnitude of load current 118 of the fully operational gateway 100.

During the transitional shutdown delay interval, word 115 might have been temporarily indicative of a smaller battery remaining time than after the shutdown of, for example, each of switch 102 and controller 103 is completed. Consequently, the battery remaining time value of word 115 could have been temporarily significantly lower than a threshold value associated with self-monitoring SLIC 108. The result might be a "race" condition in which self-monitoring SLIC 108, in responding to the temporarily low value of the battery remaining time of word 115, undesirably, would have gone into a temporary shutdown.

Moreover, the battery remaining time of word 115 is made accessible to remote devices via, for example, internet connection of gateway 100. This temporary false drop in the value of the battery remaining time of word 115 might have caused an unjustified alarm at remote locations that monitor the battery remaining time of word 115. It may be desirable to avoid such "race" condition.

In carrying out an inventive feature, during the transitional shutdown delay interval, battery 112 remaining time 115 is calculated by using a value that is indicative of, for example, estimated magnitude of current 117, instead of by using measurement results of transient magnitude in current 117 that would have been higher, as explained before. The estimated magnitude of current 117 is stored, for example, in the factory or anytime before placing gateway 100 in service based on current 117 magnitude in steady state battery backup mode operation. Thus, the aforementioned fluctuations of current 117 will have less or, preferably, no effect on word 115, during the transitional shutdown delay interval. Because battery remaining time in word 115 is, for example, unaffected by the transient loading caused by switch 102, during the transitional shutdown delay interval, any "race" condition and its potentially harmful effects will be, advantageously, prevented. Following the transitional shutdown delay interval, battery remaining time in word 115 may be calculated based on real time values of each of the current 117 from battery 112 and of the battery charge percentage indicative value in word 113, as explained before.

Figure 2:
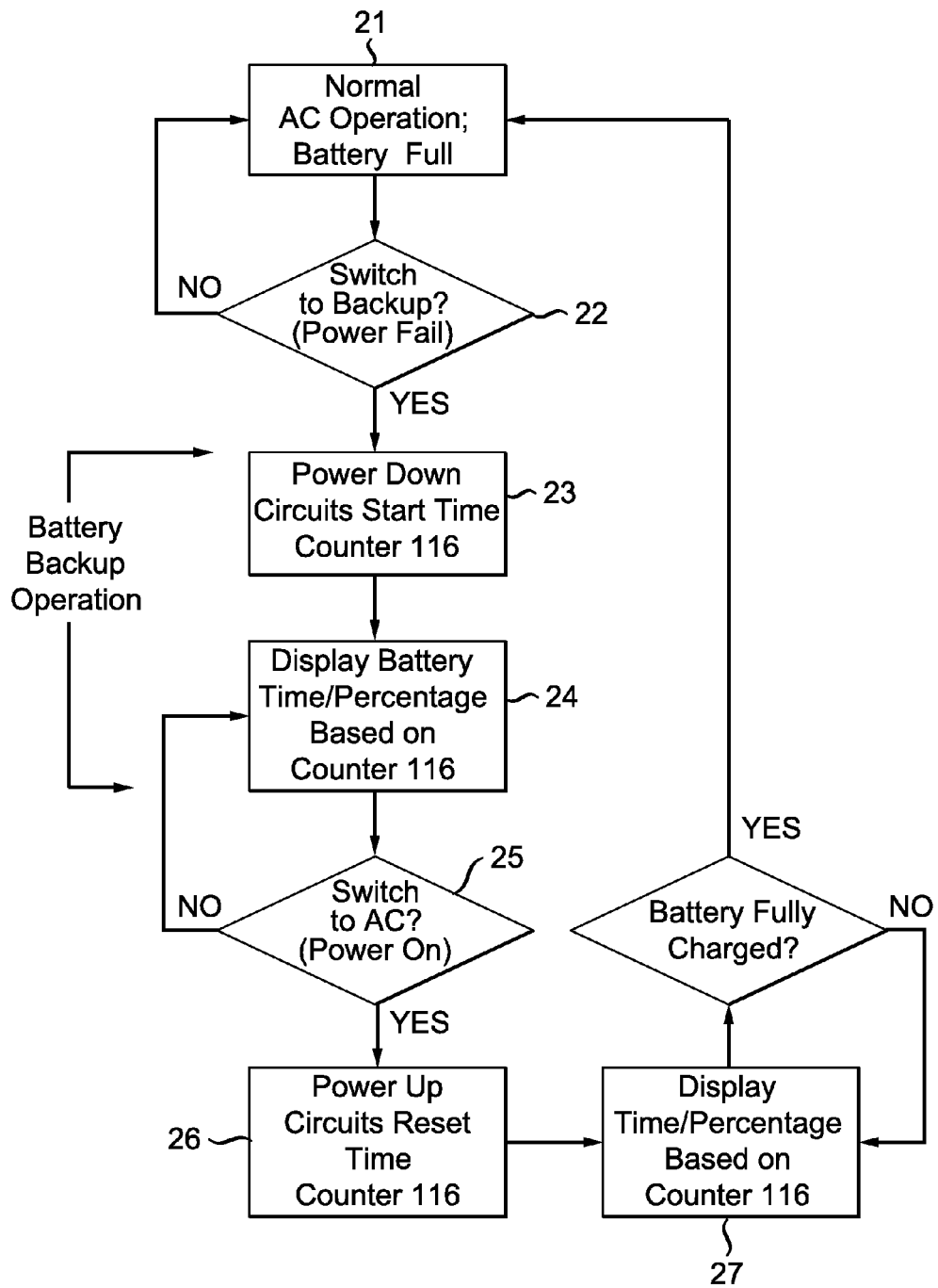
FIG. 2 illustrates a flow chart associated with an additional inventive feature of the gateway of FIG. 1.

FIG. 2 illustrates a flow chart of a method in accordance with another aspect of the invention. Method step 21 represents normal operation in which battery 112 of FIG. 1 is fully charged and mains voltage ACin energizes fully operational gateway 100. Because each of switch 102, controller 103 and SLIC 108 draw load current 118 in normal operation, battery remaining time indicative word 115 will indicate a relatively lower value than immediately after the transitional shutdown delay interval.

In step 22 of FIG. 2 an interruption in mains voltage ACin is detected. Accordingly, in step 23 controller 103 and SLIC 108 of FIG. 1 are instructed by controller 101 to shut down, as explained before. Thereafter, in the example of FIG. 2, a software counter output 116 of FIG. 1 in controller 101 starts counting at a rate that corresponds to the discharge rate of battery 112. Software counter output 116 is used in controller 101 for varying battery remaining time indicative word 115. Battery remaining time indicative word 115 and battery charge percentage indicative word 113 may be provided for display in a remote cite via internet connection. Advantageously, during the transitional shutdown delay interval, word 115 is unaffected by fluctuations in a magnitude of battery current 117 caused by the delay associated with turning off switch 102 and controller 103, as explained before.

Voltage mains voltage ACin is restored and battery backup operation ceases in step 25 of FIG. 2. Then, software counter output 116 of FIG. 1 is reset, as shown in step 26 of FIG. 2. Also, switch 102 and controller 103 are instructed by controller 101 to turn on, as shown in step 26 of FIG. 2. Additionally, recharging of battery 112 is initiated.

Until battery 112 is fully charged, software counter output 116 counts to vary battery remaining time indicative word 115 in accordance with software counter output 116, as shown in step 27 of FIG. 2. Also, the battery remaining time value in word 115 of FIG. 1 gradually increases as a result of the charging of battery 112. In step 28 of FIG. 2 it is detected that battery 112 is fully charged. In steady state normal operation of step 21, the value of the battery remaining time in word 115 of FIG. 1 is smaller than in step 24 of FIG. 2 because battery current 117 drawn in step 24 is smaller than load current 118 in step 21.

The battery remaining time when battery 112 is fully charged may be determined empirically and pre-programmed during manufacturing for the originally installed battery. In one example, this time has been determined to be 420 minutes. However, this value may be different if the user installs a new or different battery or the battery may age over time. An updated remaining time value for fully charged battery may be determined based on using the measured current-voltage characteristics during a battery backup event. This new value can then be stored for subsequent use during a subsequent battery backup operation period.

The invention claimed is:
1. An apparatus for generating a signal indicative of a battery remaining time, comprising:
  a source of a mains supply voltage for energizing a first load circuit and a second load circuit, prior to an interruption in said mains supply voltage;
  a battery for providing battery backup operation to energize said second load circuit after said interruption in said mains supply voltage is detected; and a processor coupled to said first load circuit and is configured to initiate a current drain reduction in said first load circuit after detection of said interruption, and to access a stored battery current magnitude value for use in calculating a battery remaining time indicative signal, such that, during a transitional shutdown delay interval of the apparatus that follows the detection of said interruption, said battery remaining time indicative signal is based on said stored battery current magnitude value that is unaffected by real time variations and transient loading of said battery current magnitude during said transitional shutdown delay interval and is instead based on a current magnitude in a steady state of said battery backup operation.

2. An apparatus according to claim 1 wherein said processor initiates shutdown of said first load circuit when said interruption is detected.

3. An apparatus according to claim 2 wherein said interval is longer than one minute.

4. An apparatus according to claim 2 wherein first load circuit experiences a shutdown delay that delays current drain reduction, during said interval.

5. An apparatus according to claim 2 wherein said apparatus comprises a gateway, wherein said first load circuit comprises one of a Wi-Fi processor and an Ethernet switch and wherein a second load of said load circuits comprises a subscriber line interface card (SLIC) that remains energized after the shutdown of said first load circuit.

6. An apparatus according to claim 1 wherein said processor is further responsive to a signal indicative of a battery remaining charge for generating said battery remaining time indicative signal in accordance with each of said battery remaining charge indicative signal and said current drain.

7. An apparatus according to claim 1 wherein said second load circuit is responsive to said battery remaining time indicative signal for disabling said second load circuit, during said battery backup operation, when said battery remaining time indicative signal is lower than a threshold associated with said second load circuit.

8. A method for generating a signal indicative of a battery remaining time of an apparatus, comprising:
  energizing with a source of a mains supply voltage, a first load circuit and a second load circuit, prior to an interruption in said mains supply voltage;
  providing with a battery, battery backup operation to energize said second load circuit after said interruption in said mains supply voltage is detected; and
  initiating, via a processor coupled to said first load circuit, a current drain reduction in said first load circuit after detection of said interruption, and accessing a stored battery current magnitude value for use in calculating a battery remaining time indicative signal, such that, during a transitional shutdown interval of the apparatus that follows the detection of said interruption, said battery remaining time indicative signal is based on said stored battery current magnitude value that is unaffected by real time variations and transient loading of said battery current magnitude during said transitional shutdown delay interval and is instead based on a current magnitude in a steady state of said battery backup operation.

9. The method of claim 8 wherein the stored battery current magnitude value is indicative of an estimated battery current magnitude.

10. The method of claim 8 wherein the stored battery current magnitude value is stored at a factory.

11. The apparatus of claim 1 wherein the stored battery current magnitude value is indicative of an estimated battery current magnitude.

12. The apparatus of claim 1 wherein the stored battery current magnitude is stored at a factory.

* * * * *